(12) United States Patent
Goltman et al.

(10) Patent No.: US 9,379,717 B2
(45) Date of Patent: Jun. 28, 2016

(54) APPARATUS TO REDUCE POWER OF A CHARGE PUMP

(71) Applicants: Gennady Goltman, Haifa (IL); Yongping Fan, Portland, OR (US); Kuan-Yueh Shen, Hillsboro, OR (US)

(72) Inventors: Gennady Goltman, Haifa (IL); Yongping Fan, Portland, OR (US); Kuan-Yueh Shen, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 146 days.

(21) Appl. No.: 14/129,505

(22) PCT Filed: Nov. 8, 2013

(86) PCT No.: PCT/US2013/069327
§ 371 (c)(1),
(2) Date: Dec. 26, 2013

(87) PCT Pub. No.: WO2015/069285
PCT Pub. Date: May 14, 2015

(65) Prior Publication Data
US 2015/0194970 A1    Jul. 9, 2015

(51) Int. Cl.
*H03L 7/00* (2006.01)
*H03L 7/08* (2006.01)
*H03L 7/085* (2006.01)
*H03L 7/089* (2006.01)

(52) U.S. Cl.
CPC .............. *H03L 7/0802* (2013.01); *H03L 7/085* (2013.01); *H03L 7/089* (2013.01); *H03L 7/0895* (2013.01)

(58) Field of Classification Search
CPC ................ H03L 7/0802; H03L 7/085

USPC ........................................................ 327/142
See application file for complete search history.

(56) References Cited

U.S. PATENT DOCUMENTS

| 4,819,081 | A * | 4/1989 | Volk ................... | H03L 7/10 327/12 |
|---|---|---|---|---|
| 6,198,355 | B1 * | 3/2001 | Lindquist ........... | H03D 13/004 327/12 |
| 6,483,389 | B1 * | 11/2002 | Lamb ................. | H03D 13/004 327/12 |
| 7,119,583 | B2 | 10/2006 | Johnson et al. | |
| 7,154,304 | B2 * | 12/2006 | Culmer ............... | H03L 7/10 327/12 |
| 7,382,163 | B2 * | 6/2008 | Kuo .................... | H03D 13/004 327/12 |
| 2001/0007436 | A1 * | 7/2001 | Dosho ................ | H03D 13/004 331/11 |
| 2002/0126787 | A1 * | 9/2002 | Homol ................ | H03L 7/199 375/376 |
| 2004/0091064 | A1 | 5/2004 | Cao et al. | |

(Continued)

OTHER PUBLICATIONS

International Search Report and the Written Opinion of the International Searching Authority for International Application No. PCT/US2013/069327, mailed Aug. 21, 2014, 7 pages.

*Primary Examiner* — Ryan Jager
(74) *Attorney, Agent, or Firm* — Blakely, Sokoloff, Taylor & Zafman LLP (57) ABSTRACT

Described is an apparatus to lower power of a charge pump. The apparatus comprises: a first delay unit to receive a reference clock, the first delay unit to provide a delayed reference clock to a first sequential unit; a second delay unit to receive a feedback clock, the second delay unit to provide a delayed feedback clock to a second sequential unit; a first logic unit to receive the reference and feedback clocks, the logic unit to perform a logical OR operation on the received reference and feedback clocks, and to generate a trigger signal for a third sequential unit; and a second logic unit to receive outputs of first and second sequential units, and to generate an output coupled to the third sequential unit.

20 Claims, 6 Drawing Sheets (56) References Cited

U.S. PATENT DOCUMENTS

2009/0167360 A1 7/2009 Kajita
2011/0148488 A1 6/2011 Lee et al.

* cited by examiner

APPARATUS TO REDUCE POWER OF A CHARGE PUMP

CLAIM OF PRIORITY

This application claims the benefit of priority of International Patent Application No. PCT/US2013/069327 filed Nov. 8, 2013, titled "APPARATUS TO REDUCE POWER OF A CHARGE PUMP," which is incorporated by reference in its entirety.

BACKGROUND

RF (radio-frequency) oscillators (e.g., synthesizers) and clock generators based on Phase Locked Loop (PLL) are basic building blocks of any battery (or non-battery) powered computing and communication devices like laptops, tablets, smart phones, etc. Usually, when such devices enter low power mode, PLLs of those devices continue to operate and continue to consume power. One reason for keeping the PLLs in operation is because if PLLs are switched off, the wake-up time for the devices increases due to long PLL lock time, which is normally 2-50 μs. Taking into account that PLL cannot be switched off, and the number of PLLs in a chip are increasing (e.g., ten or more PLLs in a multi-core chip), PLL power consumption cannot be ignored.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
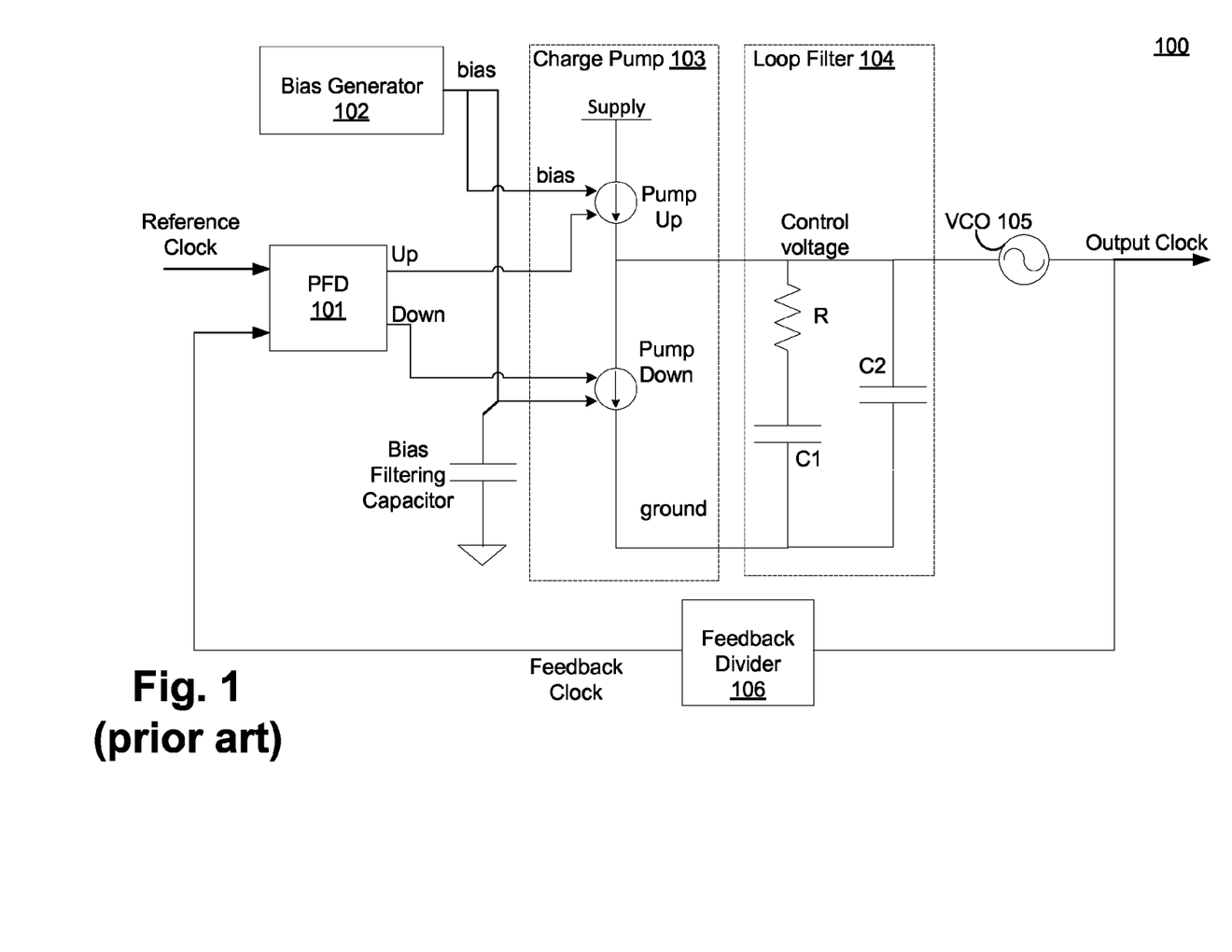
FIG. 1 illustrates a phase locked loop (PLL) with charge pump and bias generator.

FIG. 1 illustrates a phase locked loop (PLL) 100 which includes Phase Frequency Detector (PFD) 101, Bias Generator 102, Charge Pump 103, Loop Filter 104, Voltage Controlled Oscillator (VCO) 105, and Feedback Divider 106. PFD 101 compares phase and frequency of Reference Clock (RefClk) with that of Feedback Clock (FbClk), and generates Up and Down signals (or pulses) that indicate whether FbClk needs to be sped up or slowed down relative to RefClk. PFD 101 is coupled to Charge Pump 103.

Charge Pump 103 comprises current sources to pump current into capacitor C2 (and C1) or to pump current from capacitor C2 (and C1) to adjust the voltage level of Control voltage. The two pumps (or current sources) of charge pump 103 are identified as Pump Up and Pump Down. Charge Pump 103 and bias generator 102 consume significant amount of power (e.g., up to approximately 70% of the PLL power) because it is an analog circuit that operates with DC current. Here, "bias" voltage is provided by Bias Generator 102 for Pump Up and Pump down. Bias Generator 102 may also use a Bias Filtering Capacitor to filter any noise on the bias. In some embodiments of Charge Pump 103, Bias Generator 102 may supply two different bias voltages: one for Pump Up, and another for Pump Down. In some embodiments of Charge Pump 103, Bias Generator 102 may supply reference currents.

Up and Down signals are pulses that instruct Charge Pump 103 to pump up or pump down current on the node labeled "Control voltage." Here, the names of the signals and nodes are interchangeably used. For example, "bias" is used to indicate bias node or bias signal depending on the context of the sentence. When Up pulse is high, Charge Pump 103 pumps current onto capacitor C2 (and C1). When Down pulse is high, Charge Pump 103 sinks current from capacitor C2 (and C1).

Loop Filter 104 provides stability to the control loop of PLL 100. It includes an RC (resistor-capacitor) network. In this example, Loop Filter 104 includes resistor R coupled to capacitor C1 in series, and capacitor C2. The control voltage is used to control the oscillating frequency of VCO 105. Output of VCO 105 is the Output Clock (OutClk) which is used by downstream logic. OutClk is also received by Feedback Divider 106 which divides down the frequency of OutClk to generate FbClk.

Bias Generator 102 is usually a complicated circuit which may include two or more closed loop systems. For example, one closed loop system for stabilizing and balancing current of Up and Down current sources, and another closed loop system for eliminating parasitic charge injection to Loop Filter 104. Bias Generator 102 is typically one of the main power contributors inside PLL 100, especially in case when PLL 100 is producing clock for high speed interface like Peripheral Component Interface Express (PCIe), Universal Serial Bus 3 (USB3), etc.

Normally PLL 100 once locked remains in locked state. In this state, control voltage becomes almost constant and PFD 101 produces very short simultaneous Up and Down pulses. Duration of these Up and Down pulses in locked state is usually about 1% of RefClk cycle duration, which includes the minimum pulse width (e.g., 50-90 ps) and static phase error (e.g., up to 10 ps). In this case, about 99% of overall time, Bias Generator 102 consumes constant power in order to produce bias voltage for Charge Pump 103, while Charge Pump 103 does not use it because it may not need to pump current to or from the control voltage node.

The embodiments significantly reduce PLL power by providing method and apparatus which switch off Bias Generator 102 when charge pump current is not needed by PLL 100. In the embodiments, PFD 101, Bias Generator 102, and Charge Pump 103 are designed such that Bias Generator 102 is turned on when it is required and turned off when it is not required.

While the embodiments are described with reference to a PLL, they can apply to any closed loop system in which a RefClk is being compared with another clock. For example, the embodiments are also applicable for a delay locked loop (DLL).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
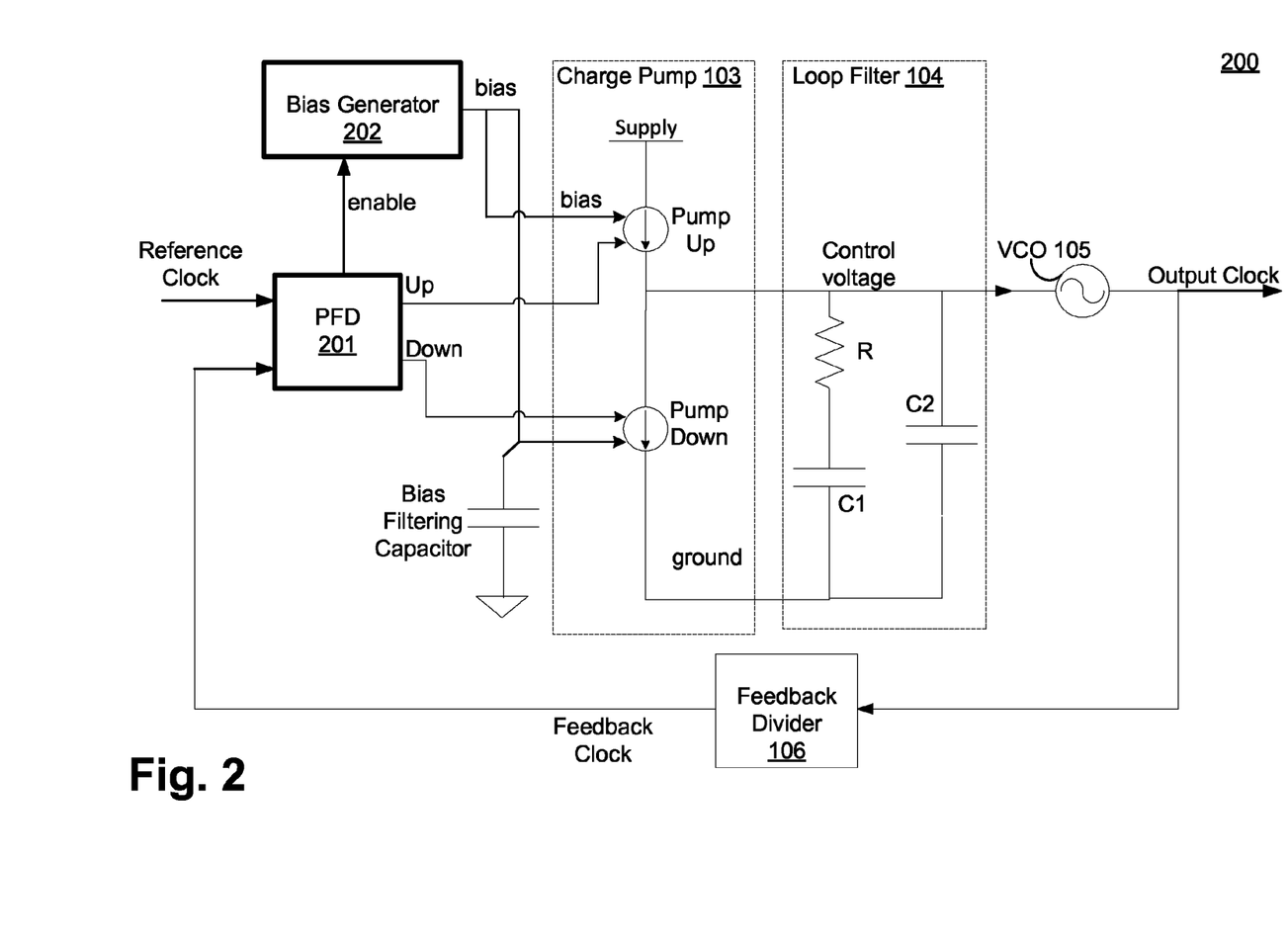
FIG. 2 illustrates a PLL with bias generator which is operable to disable according to output of phase frequency detector (PFD) to lower power of charge pump, according to one embodiment of the disclosure.

FIG. 2 illustrates a PLL 200 with bias generator which is operable to disable according to output of phase frequency detector (PFD) to lower power of charge pump, according to one embodiment of the disclosure. It is pointed out that those elements of FIG. 2 having the same reference numbers (or names) as the elements of any other figure can operate or function in any manner similar to that described, but are not limited to such. FIG. 2 is described with reference to FIG. 1. So as not to obscure the embodiments, circuits and blocks discussed previously are not discussed in detail again.

In one embodiment, PLL 200 comprises PFD 201 and Bias Generator 202 along with previously discussed components. In one embodiment, PFD 201 includes logic to generate enable signal that enables or disables Bias Generator 202 depending on whether it is needed for operating Charge Pump 103. When PLL 200 is locked, static phase error is in the order of several picoseconds (ps). In the locked condition, Up and Down pulses are very short (e.g., less than 100 ps wide or 1% of the RefClk period at 100 MHz.). In one embodiment, Bias Generator 202 is allowed to stabilize for a time period (e.g., 400 ps) before Up and Down pulses are on and then turned off after the Up and Down pulses disappear. In this example, Bias Generator 202 is turned on for a total of approximately 500 ps, and turned off for about 9.5 ns, resulting in power saving of 95%.

Figure 3:
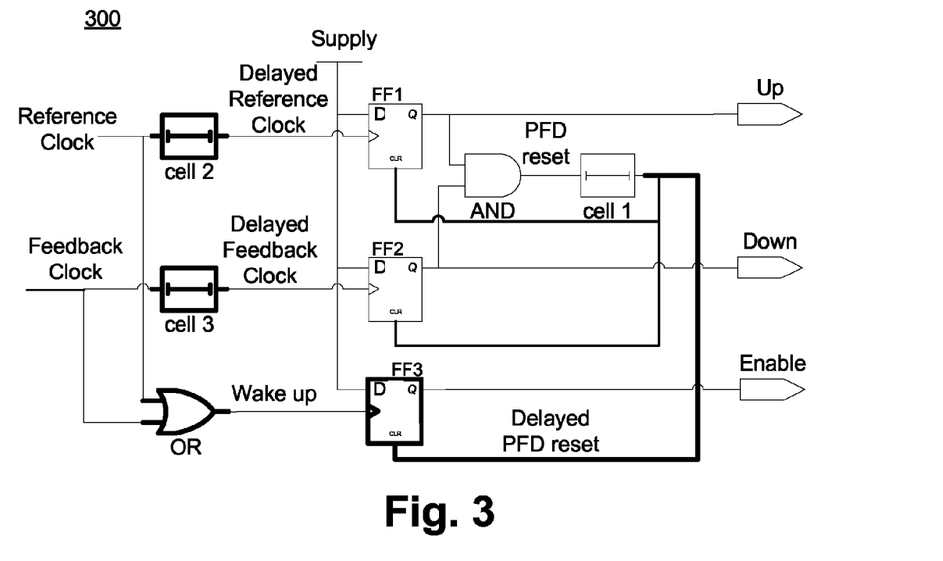
FIG. 3 illustrates a PFD which is operable to enable or disable the bias generator of the charge pump, according to one embodiment of the disclosure.

FIG. 3 illustrates a PFD 300 which is operable to enable or disable Bias Generator 202 of Charge Pump 103, according to one embodiment of the disclosure. It is pointed out that those elements of FIG. 3 having the same reference numbers (or names) as the elements of any other figure can operate or function in any manner similar to that described, but are not limited to such.

In one embodiment, PFD 300 comprises first sequential unit FF1, second sequential unit FF2, third sequential unit FF3, first logic unit (e.g., OR gate), second logic unit (e.g., AND gate and first delay cell), second delay cell, and third delay cell. In one embodiment, PFD 300 receives RefClk and FbClk and generates Up, Down, and Enable signals. In one embodiment, Enable signal is received by Bias Generator 202. Depending on the logic level of Enable signal, Bias Generator 202 is enabled or disabled, according to one embodiment.

In one embodiment, delay cell 2 and delay cell 3 receive RefClk and FbClk, respectively. In one embodiment, delay cell 2 and delay cell 3 generate Delayed RefClk and Delayed FbClk, respectively. In one embodiment, Delayed RefClk and Delayed FbClk are received as clock inputs for FF1 and FF2, respectively. In one embodiment, delay cell 2 and delay cell 3 is a chain of inverters. In other embodiments, other implementation of delay cells may be used. In one embodiment, delay cell 2 and delay cell 3 are programmable delay cells (i.e., programmable by hardware or software). In one embodiment, delay cell 2 and delay cell 3 have substantially the same delays i.e., matched delays.

In one embodiment, data inputs of FF1, FF2, and FF3 is coupled to power supply (e.g., Vcc). In one embodiment, output of FF1 is Up signal (or Up pulses). In one embodiment, output FF2 is Down signal (or Down pulses). In one embodiment, second logic unit comprises AND gate and delay cell 1. In one embodiment, AND gate receives inputs Down and Up pulses to generate PFD reset. In one embodiment, PFD reset is delayed by delay of delay cell 1 to generate Delayed PFD reset signal. In one embodiment, delay of delay cell 1 is different from delay of delay cell 2 and delay of delay cell 3. In one embodiment, delay of delay cell 1 is programmable (by software or hardware). In one embodiment, Delayed PFD reset signal is received by reset or clear (CLR) inputs of FF1, FF2, and FF3.

In one embodiment, first logic unit is an OR gate (or NOR gate). First and second logic units can be implemented with any type of logic gate and are not limited to OR, NOR, and NAND gates. In one embodiment, OR gate receives RefClk and FbClk to generate Wake Up signal. In one embodiment, Wake Up signal is received as clock input by FF3. In one embodiment, output of FF3 is Enable signal. In this embodiment, Enable signal is used to enable or disable Bias Generator 202. In one embodiment, first logic unit is an edge detector.

Figure 4:
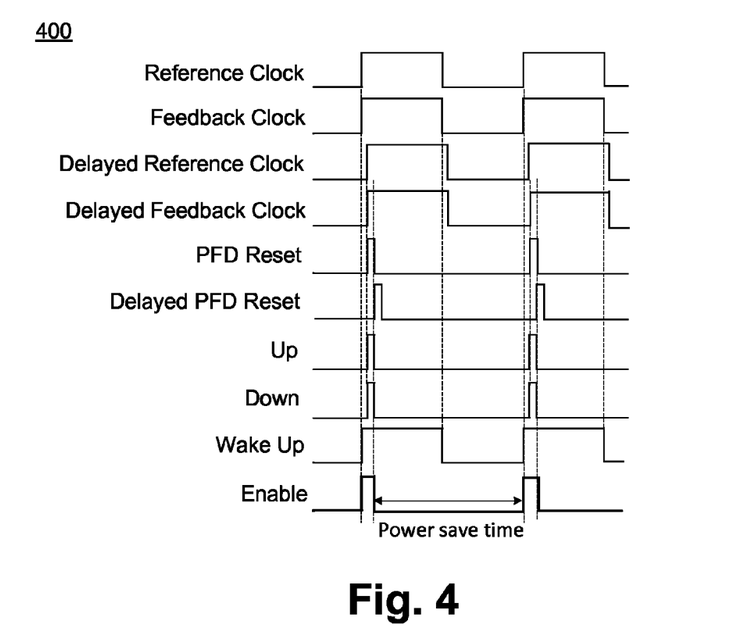
FIG. 4 illustrates a timing diagram of signals of the PFD of FIG. 3, according to one embodiment of the disclosure.

FIG. 4 illustrates a timing diagram 400 of signals of the PFD of FIG. 3, according to one embodiment of the disclosure. It is pointed out that those elements of FIG. 4 having the same reference numbers (or names) as the elements of any other figure can operate or function in any manner similar to that described, but are not limited to such.

The signals in timing diagram 400 include Reference Clock, Feedback Clock which is phase and frequency aligned relative to the Reference Clock (i.e., the case where the PLL is in stabled locked state). The signals also include Delayed Reference Clock and Delayed Feedback Clock which are delayed versions Reference Clock and Feedback Clock, respectively. These signals are delayed by delays of delay cell 2 and delay cell 3, respectively. The signals in timing diagram 400 also include PFD Reset which is output of AND gate; and Delayed PFD Reset, which is output of delay cell 1. The remaining signals of timing diagram 400 are Up, Down, Wake Up and Enable signals, where Up and Down signals are traditional PFD signals, and Wake Up and Enable signals are generated to control Bias Generator 202.

In one embodiment, OR gate which is coupled directly to Reference and Feedback Clocks produces Wake Up signal which rises each time when any of these clocks is rising. In one embodiment, the rising edge of Wake Up signal propagates High level (i.e., power supply) from D-input of FF3 to its output Q. In such an embodiment, Enable signal also is rising. In one embodiment, the rising Enable signal switches on Bias Generator 202. In this embodiment, because of delay cell 2 and delay cell 3, the rest of PFD 300 does not immediately start its operation and so Up and Down signals remain logically low.

In one embodiment, delays produced by delay cell 2 and delay cell 3 are selected to be substantially equal (or identical) in time for stabilization of bias voltage. For example, if Bias Generator 202 takes about 400 ps to provide a stabilized bias voltage, the regular PFD function starts after the bias voltage is stable.

In one embodiment, PLL 200 has a large filtering capacitor on the bias node. This capacitor stores charge and prevents charge from quickly discharging from the bias node during the time when Bias Generator 202 is disabled by the enable signal of PFD 201. In one embodiment, the delays inserted by delay cell 2 and delay cell 3 are used for refreshing the bias voltage. For example, the delays of delay cell 2 and delay cell 3 are about a few hundreds picoseconds because the bias filtering capacitor can hold the bias voltage level for that time without much degradation in the bias voltage level.

Operation of PFD 201 completes in one cycle of Reference Clock when PFD 201 produces Delayed PFD Reset. Delayed PFD Reset signal resets PFD D-flip-flops (FF1 and FF2) and switches off the current produced by Charge Pump 103 by disabling Up and Down pump (or current) sources. Up and Down pumps are disabled because bias to them is disabled. In one embodiment, the Delayed PFD Reset signal is also received by reset input of FF3, and causes to it to reset. In one embodiment, when FF3 is reset, Enable signal (coming from Q-output of the FF3) returns to logical low level and disables Charge Pump Bias Signal. In one embodiment, when PLL 200 enters low power mode, in which VCO 105 mostly consumes power, Bias Generator 202 remains off (and thus Charge Pump 103 remains off) till next rising edge of any of its input clocks.

The embodiments of FIGS. 2-3 result in significant power savings in the PLL (or DLL). For example, in PCIe (Peripheral Component Interconnect Express) gen2 (i.e., second generation) LCPLL with 5 GHz VCO oscillating frequency, PFD 202 reduces power of Charge Pump 103 by about 95%, and reduces overall PLL power by about 20%. For PLLs with VCO oscillating at lower frequencies, more overall power savings are realized by the embodiments.

Figure 5:
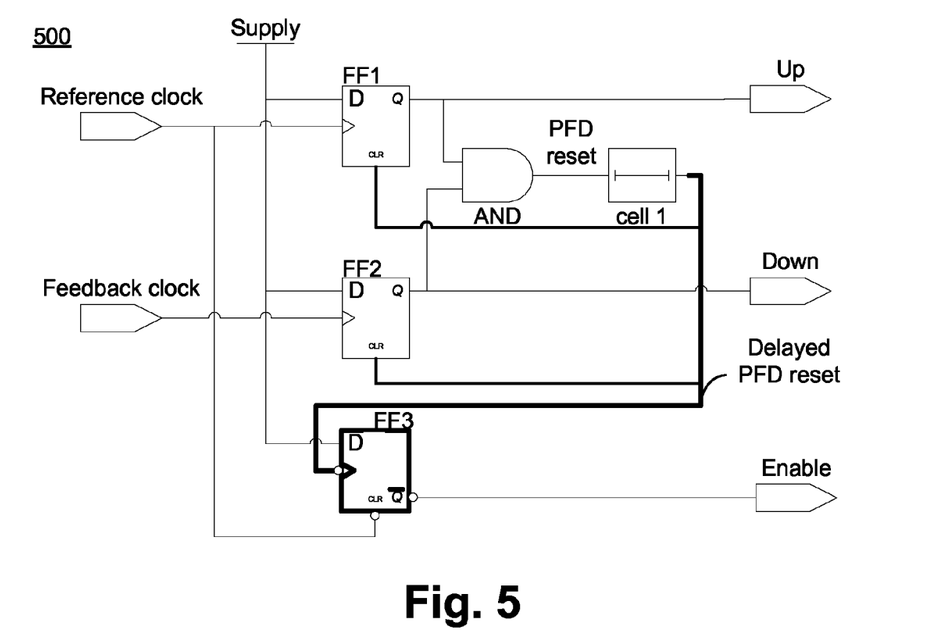
FIG. 5 illustrates a PFD which is operable to enable or disable the bias generator of the charge pump, according to another embodiment of the disclosure.

FIG. 5 illustrates a PFD 500 which is operable to enable or disable the bias generator of the charge pump, according to another embodiment of the disclosure. It is pointed out that those elements of FIG. 5 having the same reference numbers (or names) as the elements of any other figure can operate or function in any manner similar to that described, but are not limited to such.

The embodiment of FIG. 5 is described with reference to FIG. 3. Compared to the PFD 300, PFD 500 does not have the first logic unit and input path delay cells—delay cell 2 and delay cell 3. In this embodiment, Delayed PFD Reset signal is received (in inverse form) by the clock input of FF3. In this embodiment, Enable signal (which has the same function as Enable signal of PFD 300) is generated by inverted output of FF3. In this embodiment, an inverted version of Reference Clock is used to reset (or clear) FF3.

Some specific applications or implementations may not allow insertion of delay cells into Reference Clock path and Feedback Clock path. For such and other design cases, embodiment of PFD 500 may be used. In one embodiment, PFD 500 is free from delay cells at the input paths and allows Bias to Charge Pump 103 to be switched off for shorter period of time than the embodiment of FIG. 3. For example, Bias to Charge Pump 103 is switched off for about 40% of PLL overall operation time.

In one embodiment, Reference Clock is coupled directly to inversed reset input (i.e., "resetb" or "clearb") of the FF3. Here, "clearb" is the inverse of "clear" which is labeled as "CLR" in the figures. In one embodiment, Enable signal is generated by inversed output of the FF3. In this embodiment, Charge Pump bias is switched on at each falling edge of reference clock, which is the beginning of operation range of this type of PFD.

Compared to embodiment of FIG. 3, embodiment of FIG. 5 causes the bias voltages of Bias Generator 202 (and/or Charge Pump 103) to turn off during falling edge of Delayed PFD reset pulse. In this embodiment, Bias Generator 202 (and/or Charge Pump 103) may not be turned off simultaneously with falling edge of Up and Down signals, but after a waiting a pulse width of the Delayed PFD reset pulse. In one embodiment, this pulse width is substantially equal to delay of cell 1. In one embodiment, FF3 is activated with active low clock input. The embodiment of FIG. 5 functionally eliminates any race between Up/Down pulses and Enable signal. In such an embodiment, Charge Pump current is effectively stopped by Up and Down pulses and not by Bias Generator 202.

Figure 6:
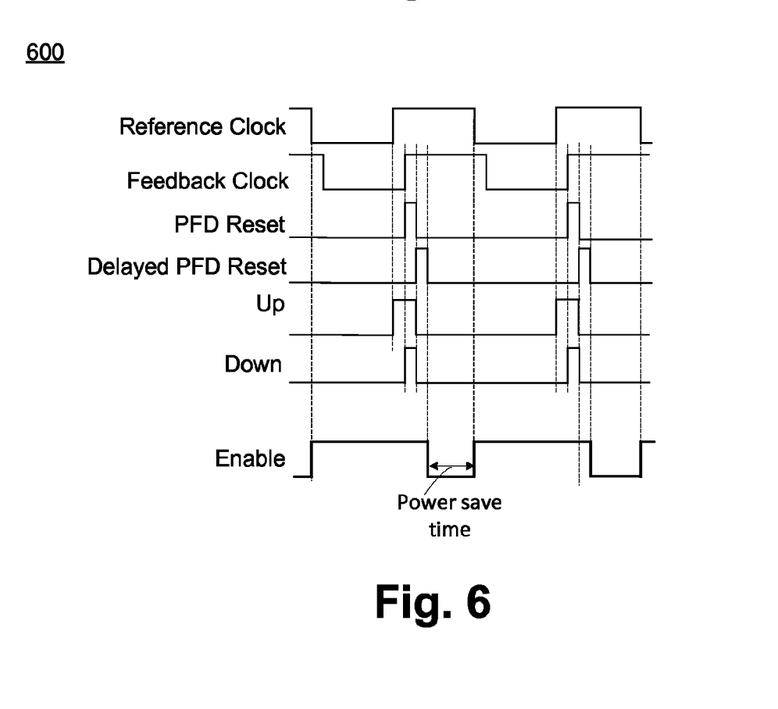
FIG. 6 illustrates a timing diagram of signals of the PFD of FIG. 5, according to one embodiment of the disclosure.

FIG. 6 illustrates a timing diagram 600 of signals of the PFD of FIG. 5, according to one embodiment of the disclosure. It is pointed out that those elements of FIG. 6 having the same reference numbers (or names) as the elements of any other figure can operate or function in any manner similar to that described, but are not limited to such.

Timing diagram 600 includes signals of PFD 500. These signals include Reference Clock, Feedback Clock, PFD Reset, Delayed PFD Reset, Up, Down, and Enable signals.

Here, Reference Clock, Feedback Clock, PFD Reset, Delayed PFD Reset, Up, and Down signals operate the same way as shown and described with reference to FIG. 4.

In this embodiment, Delayed PFD Reset is coupled to inversed clock input of FF3, while its 'D' input is coupled to High Level (i.e., power supply). In this embodiment, Enable signal becomes low and Charge Pump Bias is switched off after PFD 201 completes its operation. In this embodiment, Bias Generator 202 is turned off for a shorter time period compared to the embodiment of FIG. 3. In this embodiment, Bias Generator 202 is turned on using the falling edge of Reference Clock and remains turned on till Delayed PFD Reset is de-asserted.

Figure 7:
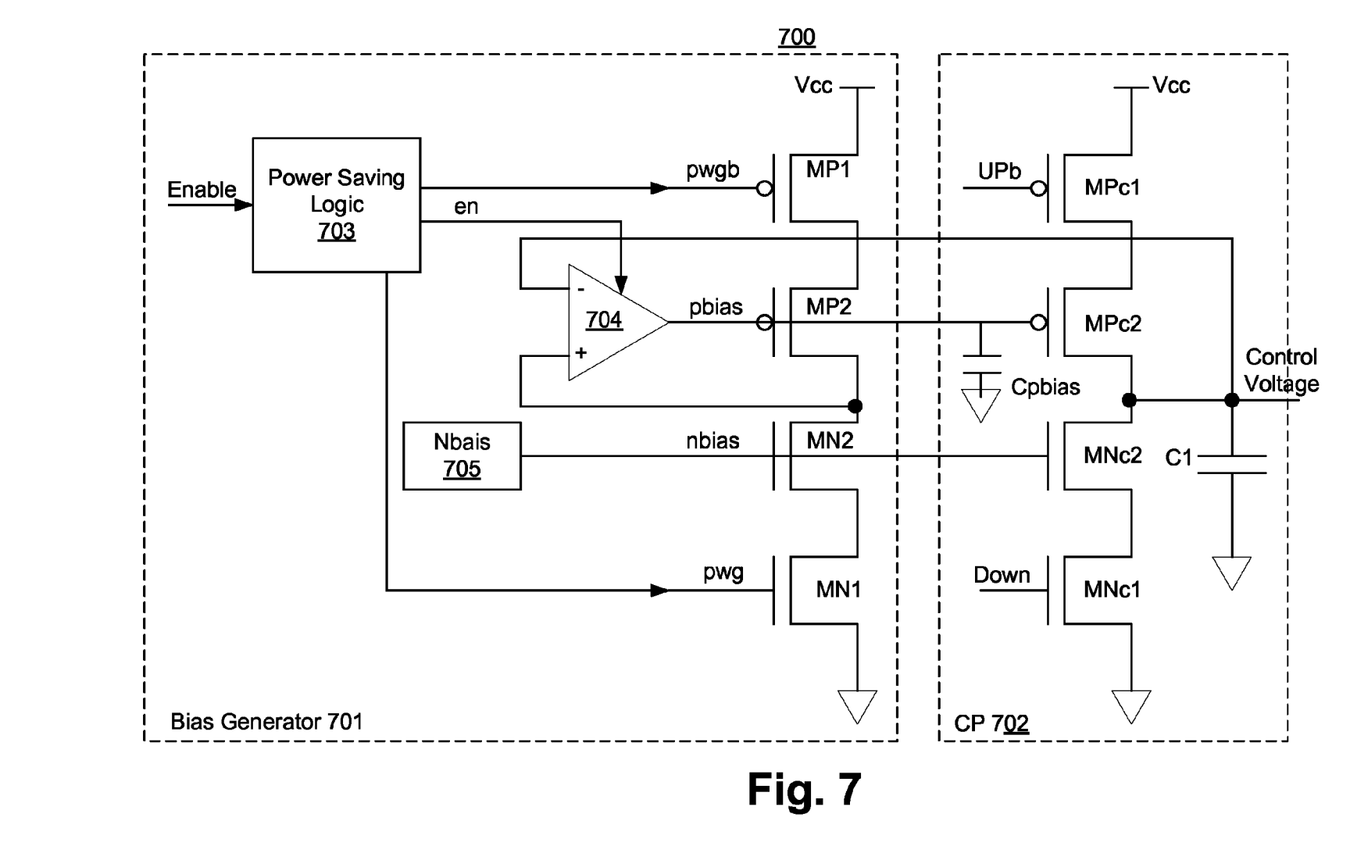
FIG. 7 illustrates a circuit with bias generator and charge pump, according to one embodiment of the disclosure.

FIG. 7 illustrates a circuit 700 with Bias Generator 701 (e.g., 202) and Charge Pump (CP) 702 (e.g., 103), according to one embodiment of the disclosure. It is pointed out that those elements of FIG. 7 having the same reference numbers (or names) as the elements of any other figure can operate or function in any manner similar to that described, but are not limited to such.

The embodiment of FIG. 7 illustrates how Enable signal from PFD 201 is used to reduce power of CP 702 and Bias Generator 701. In one embodiment, Bias Generator 701 comprises Power Saving Logic 703; amplifier 704; Nbias generator 705; p-type transistors MP1 and MP2; and n-type transistors MN1 and MN2. In one embodiment, Nbias generator 705 generates nbias signal while amplifier 704 generates pbias signal. In one embodiment, nbias and pbias signals are used to bias transistors of CP 702.

In one embodiment, Power Saving Logic 703 receives Enable signal form PFD 201 and generates internal control signals including "en," "pegb," and "pwg," where "pwgb" is an inverse of "pwg." In one embodiment, enable signal "en" turns off amplifier 704 after Up and Down pulses have asserted and de-asserted i.e., during power saving times of FIG. 4 and FIG. 6. Referring back to FIG. 7, during power saving times of FIG. 4 and FIG. 6, Power Saving Logic 703 also turns off MP1 via "pwgb" signal, and also turns off MN1 via "pwg" signal. Referring back to FIG. 7, during power saving times of FIG. 4 and FIG. 6, Power Saving Logic 703 may turn off Nbias generator.

In one embodiment, CP 702 comprises p-type transistors MPc1 and MPc2; and n-type transistors MNc1 and MNc2. While the embodiments illustrate pbias compensation capacitor Cpbias as residing in CP 702, it can reside in Bias Generator 701. In one embodiment, MPc1 is controlled by Upb (i.e., inverse of UP signal) from PFD 201. In one embodiment, MNc1 is controlled by Down signal from PFD 201. In one embodiment, MPc2 is biased by pbias while MNc2 is biased by nbias.

Figure 8:
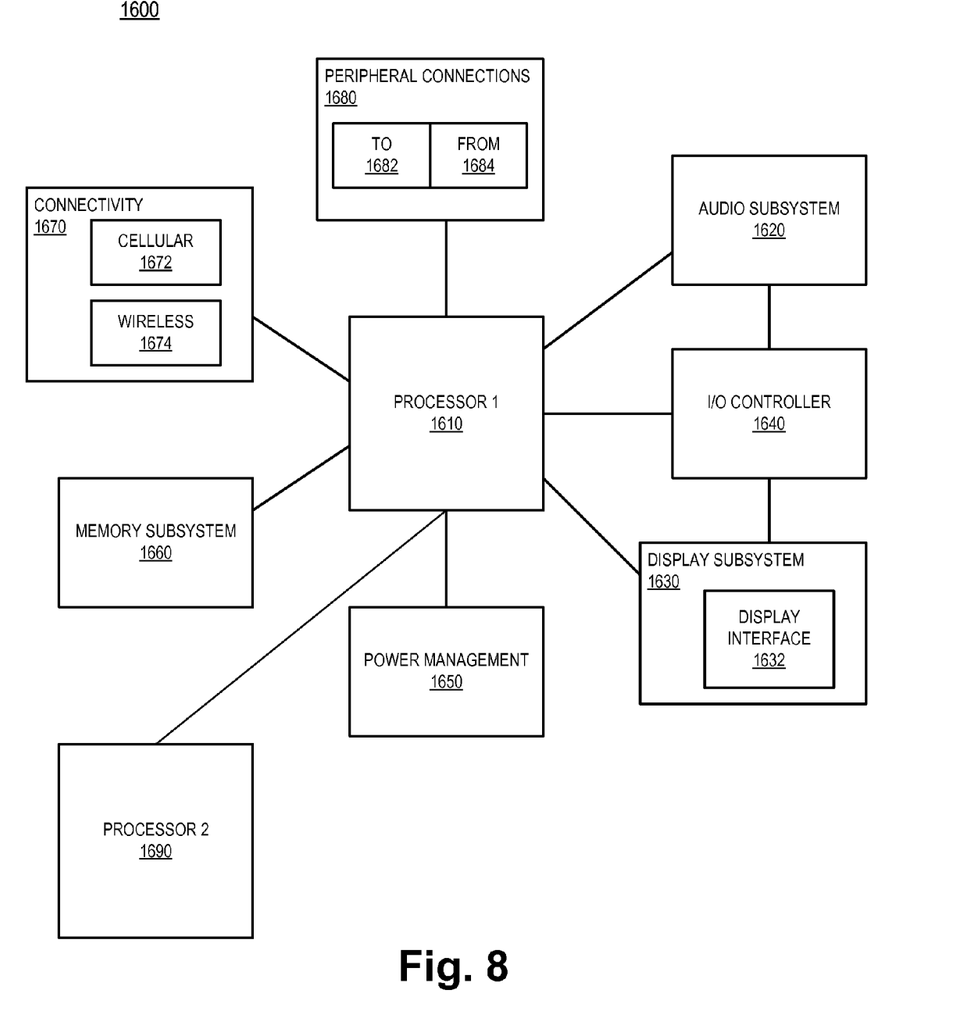
FIG. 8 is a smart device or a computer system or an SoC (system-on-chip) with PFD which is operable to enable or disable the bias generator of the charge pump, according to one embodiment of the disclosure.

FIG. 8 is a smart device or a computer system or an SoC (system-on-chip) 1600 with PFD which is operable to enable or disable the bias generator of the charge pump, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with PFD which is operable to enable or disable the bias generator of the charge pump described with reference to embodiments discussed. Other blocks of the computing device 1600 may also include PFD which is operable to enable or disable the bias generator of the charge pump described with reference to embodiments. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and/or processor 1690) can include one or more physical devices, such as microprocessors, application processors, microcontrollers, programmable logic devices, or other processing means. Processor 1690 may be optional. While the embodiment shows two processors, a single or more than two processors may be used. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first delay unit to receive a reference clock, the first delay unit to provide a delayed reference clock to a first sequential unit; a second delay unit to receive a feedback clock, the second delay unit to provide a delayed feedback clock to a second sequential unit; a first logic unit to receive the reference and feedback clocks, the logic unit to perform a logical OR operation on the received reference and feedback clocks, and to generate a trigger signal for a third sequential unit; and a second logic unit to receive outputs of first and second sequential units, and to generate an output coupled to the third sequential unit.

In one embodiment, the second logic unit comprises: an AND gate with a first input coupled to an output of the first sequential unit, and a second input coupled to an output of the second sequential unit. In one embodiment, the second logic unit further comprises a third delay unit to receive an output of the AND gate and to generate the output. In one embodiment, the output of the third delay unit is coupled to reset or clear inputs of the first, second, and third sequential units. In one embodiment, the first and second delay units have substantially equal delays. In one embodiment, the first and second delay units have programmable delays.

In one embodiment, the first sequential unit generates an Up output for a charge pump, wherein the second sequential unit generates a Down output for the charge pump, and wherein the third sequential unit generates an enable signal. In one embodiment, the apparatus further comprises a bias generation circuit to generate bias for the charge pump. In one embodiment, output of the third sequential unit enables or disables the bias generation circuit. In one embodiment, the third sequential unit disables the bias generation circuit after the Up and Down outputs transition completes. In one embodiment, the third sequential unit enables the bias generation circuit before the Up and Down outputs are generated.

In another example, an apparatus is provided which comprises: a first sequential unit to receive a reference clock; a second sequential unit to receive a feedback clock; a logic unit to receive outputs of the first and second sequential units and to generate an output; and a third sequential unit to receive the reference clock and the output of the logic unit. In one embodiment, the logic unit comprises: an AND gate with a first input coupled to an output of the first sequential unit, and a second input coupled to an output of the second sequential unit. In one embodiment, the logic unit further comprises a delay unit to receive an output of the AND gate and to generate the output of the logic unit. In one embodiment, the output of the delay unit is coupled to reset or clear inputs of the first, second, and third sequential units. In one embodiment, the apparatus further comprises a bias generation circuit to receive output of the third sequential unit.

In one embodiment, the apparatus further comprises a charge pump to receive bias from the bias generation circuit. In one embodiment, the third sequential unit disables the bias generation circuit after outputs of the first and second sequential units complete their transition. In one embodiment, the third sequential unit to enable the bias generation circuit when the reference clock transitions.

In another example, a system is provided which comprises: a memory unit; a processor coupled to the memory unit, the processor having a phase locked loop according the apparatus discussed above; and a wireless interface for allowing the processor to communicate with another drive.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first delay unit to receive a reference clock, the first delay unit to provide a delayed reference clock to a first sequential unit;
   a second delay unit to receive a feedback clock, the second delay unit to provide a delayed feedback clock to a second sequential unit;
   a first logic unit to receive the reference and feedback clocks, the logic unit to perform a logical OR operation on the received reference and feedback clocks, and to generate a trigger signal for a third sequential unit; and
   a second logic unit to receive outputs of first and second sequential units, and to generate an output coupled to the third sequential unit.

2. The apparatus of claim 1, wherein the second logic unit comprises:
   an AND gate with a first input coupled to an output of the first sequential unit, and a second input coupled to an output of the second sequential unit.

3. The apparatus of claim 2, wherein the second logic unit further comprises a third delay unit to receive an output of the AND gate and to generate the output.

4. The apparatus of claim 3, wherein the output of the third delay unit is coupled to reset or clear inputs of the first, second, and third sequential units.

5. The apparatus of claim 1, wherein the first and second delay units have substantially equal delays.

6. The apparatus of claim 1, wherein the first and second delay units have programmable delays.

7. The apparatus of claim 1, wherein the first sequential unit to generate an Up output for a charge pump, wherein the second sequential unit to generate a Down output for the charge pump, and wherein the third sequential unit to generate an enable signal.

8. The apparatus of claim 7 further comprises a bias generation circuit to generate bias for the charge pump.

9. The apparatus of claim 8, wherein output of the third sequential unit to enable or disable the bias generation circuit.

10. The apparatus of claim 9, wherein the third sequential unit to disable the bias generation circuit after the Up and Down outputs transition completes.

11. The apparatus of claim 9, wherein the third sequential unit to enable the bias generation circuit before the Up and Down outputs are generated.

12. An apparatus comprising:
    a first sequential unit to receive a reference clock;
    a second sequential unit to receive a feedback clock;
    a logic unit to receive outputs of the first and second sequential units and to generate an output; and
    a third sequential unit with a reset or clear input and a clock input, the reset or clear input to receive the reference clock and the clock input to receive the output of the logic unit.

13. The apparatus of claim 12, wherein the logic unit comprises:

an AND gate with a first input coupled to an output of the first sequential unit, and a second input coupled to an output of the second sequential unit.

14. The apparatus of claim 13, wherein the logic unit further comprises a delay unit to receive an output of the AND gate and to generate the output of the logic unit.

15. The apparatus of claim 14, wherein the output of the delay unit is coupled to reset or clear inputs of the first and second sequential units.

16. An apparatus comprising:
a first sequential unit to receive a reference clock;
a second sequential unit to receive a feedback clock;
a logic unit to receive outputs of the first and second sequential units and to generate an output;
a third sequential unit to receive the reference clock and the output of the logic unit;
a bias generation circuit to receive output of the third sequential unit; and
a charge pump to receive bias from the bias generation circuit.

17. The apparatus of claim 16, wherein the third sequential unit to disable the bias generation circuit after outputs of the first and second sequential units complete their transition.

18. The apparatus of claim 16, wherein the third sequential unit to enable the bias generation circuit when the reference clock transitions.

19. A system comprises:
a memory unit;
a processor coupled to the memory unit, the processor having a phase locked loop which includes:
a first delay unit to receive a reference clock, the first delay unit to provide a delayed reference clock to a first sequential unit;
a second delay unit to receive a feedback clock, the second delay unit to provide a delayed feedback clock to a second sequential unit;
a first logic unit to receive the reference and feedback clocks, the logic unit to perform a logical OR operation on the received reference and feedback clocks, and to generate a trigger signal for a third sequential unit; and
a second logic unit to receive outputs of first and second sequential units, and to generate an output coupled to the third sequential unit; and
a wireless interface for allowing the processor to communicate with another drive.

20. The system of claim 19 further comprises a display unit.

* * * * *